(12) United States Patent
Song

(10) Patent No.: US 11,233,099 B2
(45) Date of Patent: Jan. 25, 2022

(54) DISPLAY PANEL, METHOD FOR MANUFACTURING THE SAME, AND DISPLAY DEVICE

(71) Applicant: BOE TECHNOLOGY GROUP CO., LTD., Beijing (CN)

(72) Inventor: Wenfeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 350 days.

(21) Appl. No.: 16/395,122

(22) Filed: Apr. 25, 2019

(65) Prior Publication Data

US 2020/0098836 A1    Mar. 26, 2020

(30) Foreign Application Priority Data

Sep. 21, 2018 (CN) .......................... 201811116901.1

(51) Int. Cl.
*G02F 1/07* (2006.01)
*H01L 27/32* (2006.01)
*G02F 1/1335* (2006.01)

(52) U.S. Cl.
CPC .... *H01L 27/3232* (2013.01); *G02F 1/133514* (2013.01); *H01L 27/322* (2013.01); *H01L 27/3213* (2013.01); *G02F 2202/14* (2013.01)

(58) Field of Classification Search
CPC ........... G02F 1/133514; G02F 2202/14; G02F 1/133354; G02F 2201/086; G02F 1/133617; G02F 2201/52
See application file for complete search history.

(56) References Cited

U.S. PATENT DOCUMENTS

| 9,851,600 | B2 | 12/2017 | Na et al. |
| 10,332,940 | B2 | 6/2019 | Choi et al. |
| 2015/0349029 | A1 | 12/2015 | Choi et al. |

FOREIGN PATENT DOCUMENTS

| CN | 105319760 A | 2/2016 | |
| CN | 105353533 | * 2/2016 | ............... G02F 1/13 |
| CN | 105353533 A | 2/2016 | |
| CN | 106898632 A | 6/2017 | |

OTHER PUBLICATIONS

First Chinese Office Action dated Mar. 3, 2020, received for corresponding Chinese Application No. 201811116901.0, 16 pages.

* cited by examiner

*Primary Examiner* — Joseph P Martinez
(74) *Attorney, Agent, or Firm* — Kinney & Lange, P.A.

(57) ABSTRACT

A display panel, a method for manufacturing the same, and a display device are disclosed. The display panel comprises: a first substrate; a plurality of pixel structures disposed on a surface of the first substrate, each of the pixel structures comprising a first sub-pixel, a second sub-pixel, a third sub-pixel and a white sub-pixel; and a photochromic layer, wherein an orthographic projection of the photochromic layer on the first substrate is covered by an orthographic projection of the white sub-pixel on the first substrate.

15 Claims, 3 Drawing Sheets

DISPLAY PANEL, METHOD FOR MANUFACTURING THE SAME, AND DISPLAY DEVICE

CROSS REFERENCE TO RELATED APPLICATION

The present application claims a priority benefit of Chinese Patent Application No. 201811116901.1, filed on Sep. 21, 2018, the entirety of which is incorporated herein by reference.

TECHNICAL FIELD

The present disclosure relates to the technical field of display, and particularly to a display panel, a method for manufacturing the same, and a display device.

BACKGROUND

Currently, organic light emitting diode (OLED) devices have become a competitive and promising new generation of display technology, because of their advantages of having all solid state structure, high luminance, full view angle, rapid response, flexible display and the like.

At present, to improve the contrast of OLED displays, typically, a polarizer is attached to a light-exiting surface, which will effectively reduce the intensity of reflection due to natural incident light. However, the use of the polarizer not only significantly reduces the reflectivity, but also significantly reduces the organic light emitting intensity, resulting in low light output ratio.

SUMMARY

In an aspect, the present disclosure provides a display panel.

According to an embodiment of the present disclosure, the display panel comprises:

a first substrate;

a plurality of pixel structures disposed on a surface of the first substrate, each of the pixel structures comprising a first sub-pixel, a second sub-pixel, a third sub-pixel and a white sub-pixel; and a photochromic layer, wherein an orthographic projection of the photochromic layer on the first substrate is covered by an orthographic projection of the white sub-pixel on the first substrate.

Furthermore, the display panel according to the above embodiment of the present disclosure may further comprise the following additional technical features.

According to the embodiment of the present disclosure, the orthographic projection of the photochromic layer on the first substrate is at least partially overlapped with an orthographic projection of a light emitting layer of the white sub-pixel on the first substrate.

According to the embodiment of the present disclosure, the photochromic layer is formed from an ultraviolet fluorescent material.

According to the embodiment of the present disclosure, the photochromic layer has a thickness of 2 to 3 µm.

According to the embodiment of the present disclosure, the first sub-pixel is one of a red (R) sub-pixel, a green (G) sub-pixel, or a blue (B) sub-pixel, the second sub-pixel is another one of the R sub-pixel, G sub-pixel or B sub-pixel, and the third sub-pixel is the remaining one of the R sub-pixel, G sub-pixel or B sub-pixel.

According to the embodiment of the present disclosure, the display panel further comprises a second substrate opposite to the first substrate, wherein the plurality of pixel structures are disposed between the first substrate and the second substrate, and the photochromic layer is disposed in a white sub-pixel region on a side of the second substrate close to the first substrate.

According to the embodiment of the present disclosure, the photochromic layer and color film layers of the first sub-pixel, the second sub-pixel and the third sub-pixel are disposed in the same layer.

According to the embodiment of the present disclosure, the display panel further comprises a color film sub-layer disposed in the white sub-pixel region on the side of the second substrate close to the first substrate, wherein an orthographic projection of the color film sub-layer on the first substrate is not overlapped with the orthographic projection of the photochromic layer on the first substrate.

According to the embodiment of the present disclosure, the color film sub-layer is disposed in the same layer as the photochromic layer.

According to the embodiment of the present disclosure, an area of the orthographic projection of the color film sub-layer on the first substrate is the same as an area of the orthographic projection of the photochromic layer on the first substrate.

According to the embodiment of the present disclosure, both a first color film layer of the first sub-pixel and the color film sub-layer are formed from a red color resist, and the photochromic layer is formed from a red fluorescent material; or both a second color film layer of the second sub-pixel and the color film sub-layer are formed from a blue color resist, and the photochromic layer is formed from a blue fluorescent material; or both a third color film layer of the third sub-pixel and the color film sub-layer are formed from a green color resist, and the photochromic layer is formed from a green fluorescent material.

According to the embodiment of the present disclosure, the first substrate comprises a flexible substrate or a glass substrate.

In another aspect, the present disclosure provides a method for manufacturing a display panel.

According to an embodiment of the present disclosure, the method comprises:

providing a first substrate;

fabricating a plurality of pixel structures on a surface of the first substrate, each of the pixel structures comprising a first sub-pixel, a second sub-pixel, a third sub-pixel and a white sub-pixel; and forming a photochromic layer, wherein an orthographic projection of the photochromic layer on the first substrate is covered by an orthographic projection of the white sub-pixel on the first substrate.

Furthermore, the manufacturing method according to the above embodiment of the present disclosure may further comprise the following additional technical features.

According to the embodiment of the present disclosure, said forming the photochromic layer comprises:

providing a second substrate; and applying an organic resin containing an ultraviolet fluorescent material in a white sub-pixel region of the second substrate to form the photochromic layer.

According to the embodiment of the present disclosure, the method further comprises forming a color film sub-layer in the white sub-pixel region of the second substrate, wherein the color film sub-layer is formed along with a first color film layer of the first sub-pixel region, a second color film layer of the second sub-pixel region or a third color film layer of the third sub-pixel region by one process.

According to the embodiment of the present disclosure, the method further comprises:

assembling the first substrate and the second substrate with cells aligned, wherein, after the assembling, an orthographic projection of the color film sub-layer on the first substrate is not overlapped with the orthographic projection of the photochromic layer on the first substrate.

In yet another aspect, the present disclosure provides a display device comprising the display panel as described above.

According to an embodiment of the present disclosure, the display device comprises an organic light emitting diode (OLED) display device or a liquid crystal display (LCD) device.

BRIEF DESCRIPTION OF THE DRAWINGS

The above aspects of the present disclosure will be explained by describing the embodiments with reference to the drawings, in which.

DETAILED DESCRIPTION

Embodiments of the present disclosure will be described in detail below. It will be appreciated by those skilled in the art that the following embodiments are intended to illustrate, but not to limit the present disclosure. In the case where no particular technologies or conditions are specifically described in the following embodiments, the embodiments may be implemented by those skilled in the art with commonly used technologies or conditions in the art or according to the product instructions, unless otherwise specified.

In an aspect, the present disclosure provides a display panel.

Figure 1A:
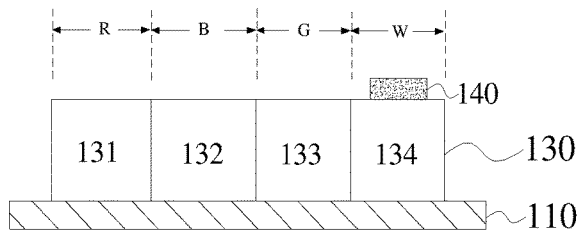
FIG. 1(a) is a schematic diagram of the section structure of a display panel according to an embodiment of the present disclosure.
Figure 1B:
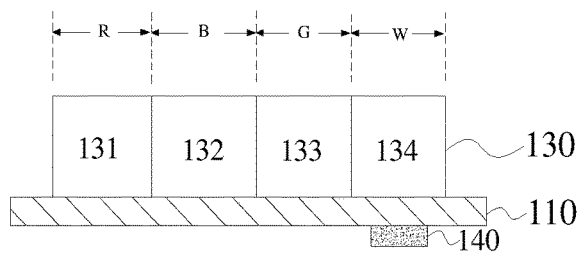
FIG. 1(b) is a schematic diagram of the section structure of a display panel according to another embodiment of the present disclosure.

According to the embodiments, with reference to FIGS. 1(a) and 1(b), the display panel comprises a first substrate 110, a plurality of pixel structures 130 and a photochromic layer 140, wherein the plurality of pixel structures 130 are disposed on a surface of the first substrate 110, each of the pixel structures 130 comprising a first sub-pixel 131, a second sub-pixel 132, a third sub-pixel 133 and a white sub-pixel 134, and the photochromic layer 140 may be disposed on a side of the pixel structures 130 away from the first substrate 110 (see FIG. 1(a)), or on a side of the first substrate 110 away from the pixel structures 130 (see FIG. 1(b)), as long as an orthographic projection of the photochromic layer 140 on the first substrate 110 is covered by an orthographic projection of the white sub-pixel 134 on the first substrate 110 (i.e. the orthographic projection of the photochromic layer 140 is within the orthographic projection of the white sub-pixel 134). It should be noted that although only one pixel structure 130 is schematically depicted in FIGS. 1(a) and 1(b) (and FIG. 2 to FIG. 5 below), in practice, the number of the pixel structures 130 may be particularly designed by those skilled in the art depending on the resolution of the display panel, which will not be reiterated here.

According to the embodiments of the present disclosure, the first sub-pixel may be one of a red (R) sub-pixel, a green (G) sub-pixel, or a blue (B) sub-pixel, the second sub-pixel may be another one of the R sub-pixel, G sub-pixel or B sub-pixel, and the third sub-pixel may be the remaining one of the R sub-pixel, G sub-pixel or B sub-pixel. For example, the first sub-pixel may be a red (R) sub-pixel, the second sub-pixel may be a green (G) sub-pixel, and the third sub-pixel may be a blue (B) sub-pixel.

During research, the inventors have discovered that for a four color (RGBW) sub-pixel design, by adding a photochromic layer in a region corresponding to the white (W) sub-pixel 134 (for example, in a white sub-pixel region), the photochromic layer 140, when directly irradiated by natural light, can effectively absorb the natural light, and turn to dark color (such as red (R), blue (B) or green (G)) from colorless. As a result, the screen whitening problem when displaying a black image is alleviated, while the overall contrast of the screen is improved, and also the light output ratio will not be influenced significantly because no polarizer is needed.

According to the embodiments of the present disclosure, an ultraviolet fluorescent material may be selected as the material of the photochromic layer 140. As such, when the photochromic layer 140 is directly irradiated by natural light, the photochromic layer 140 only absorbs the ultraviolet light to change color, but will not absorb the visible light in the natural light. As a result, the output light color of the white sub-pixel 134 will not be influenced, ensuring the chrominance of the display panel during indoor display.

According to the embodiments of the present disclosure, the first substrate 110 may be a flexible substrate or a glass substrate.

According to the embodiments of the present disclosure, the first substrate 110 may be a transparent substrate.

Figure 2:
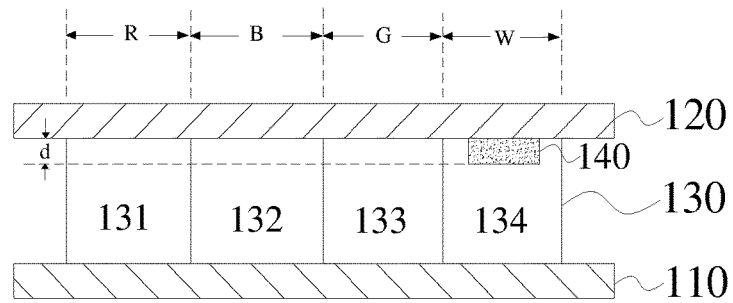
FIG. 2 is a schematic diagram of the section structure of a display panel according to another embodiment of the present disclosure.

In some embodiments of the present disclosure, with reference to FIG. 2, the display panel may further comprise a second substrate 120 (the material of which may be the same as or different from that of the first substrate 110) opposite to the first substrate 110, wherein the plurality of pixel structures 130 are disposed between the first substrate 110 and the second substrate 120, and the photochromic layer 140 is disposed in a white sub-pixel 134 region on a side of the second substrate 120 close to the first substrate 110. As such, the design of four color sub-pixel structure with the photochromic layer 140 is suitable for both a display panel of an organic light emitting diode (OLED) and a display panel of a liquid crystal display (LCD), and can effectively alleviate the screen whitening problem when displaying a black image in the display panel of OLED or LCD, thereby improving the overall contrast of the screen.

According to the embodiments of the present disclosure, the thickness of the photochromic layer 140 is not particularly limited, and may be designed by those skilled in the art depending on particular use conditions of the display panel. In some embodiments of the present disclosure, with reference to FIG. 2, the photochromic layer 140 may have a thickness d of 2 to 3 µm. As such, by using the photochromic layer 140 having the above thickness, the luminance of the white sub-pixel 134 can be well adjusted whether the display panel is used indoor or outdoor. If the thickness of the photochromic layer 140 is less than 2 µm, the effect of color change upon absorbing ultraviolet light may be not significant. If the thickness of the photochromic layer 140 is greater than 3 µm, the light output ratio of the display panel may be reduced by e.g. a half or more under direct irradiation of natural light.

Figure 3:
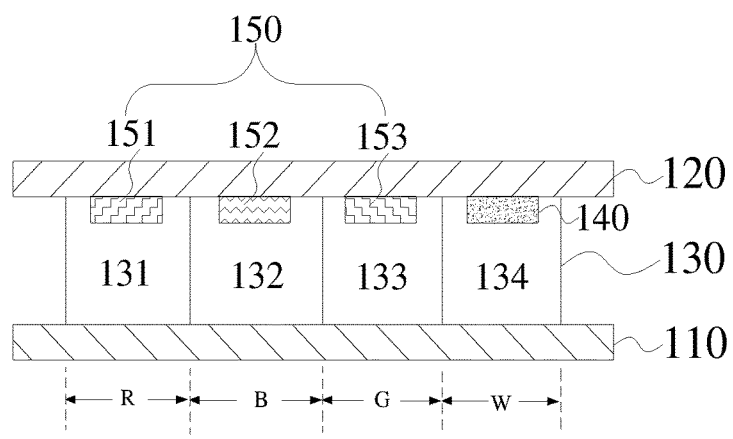
FIG. 3 is a schematic diagram of the section structure of a display panel according to another embodiment of the present disclosure.

According to the embodiments of the present disclosure, with reference to FIG. 3, the first sub-pixel 131 has a first color film layer 151. The second sub-pixel 132 has a second color film layer 152. The third sub-pixel 133 has a third color film layer 153. The color film 150 comprises the first color film layer 151, the second color film layer 152 and the third color film layer 153. The photochromic layer 140 of the white sub-pixel 134 is disposed in the same layer as the color film layer 150 of the first sub-pixel 131, the second sub-pixel 132 and the third sub-pixel 133. As such, the photochromic layer 140 is disposed at a position in the white sub-pixel 134 where a color film layer ought to be disposed, so it will not additionally increase the thickness of the display panel, ensuring thinning and lightweight design of the display panel.

Figure 4:
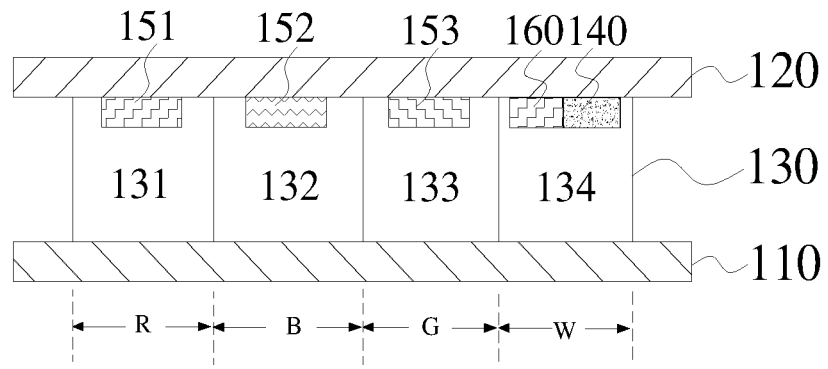
FIG. 4 is a schematic diagram of the section structure of a display panel according to another embodiment of the present disclosure.

In some embodiments of the present disclosure, with reference to FIG. 4, a color film sub-layer 160 may be further disposed in the white sub-pixel 134 region on the side of the second sub-pixel 120 close to the first substrate 110, wherein an orthographic projection of the color film sub-layer 160 on the first sub-pixel 110 is not overlapped with the orthographic projection of the photochromic layer 140 on the first substrate 110. For example, the color film sub-layer 160 may be disposed in the same layer as the photochromic layer 140. As such, the photochromic layer 140 may turn to the same color as the color film sub-layer 160 under irradiation of natural light, thereby more effectively alleviating the whitening phenomenon of the display panel when the screen is black. According to the embodiments of the present disclosure, the area ratio of the color film sub-layer 160 to the photochromic layer 140 is not particularly limited, and may be adjusted by those skilled in the art depending on particular material of the photochromic layer 140. In some particular examples, the area of the color film sub-layer 160 (the area of the orthographic projection of the color film sub-layer 160 on the first substrate 110) may be the same as the area of the photochromic layer 140 (the area of the orthographic projection of the photochromic layer 140 on the first substrate 110). As such, when the screen is black, there is not whitening phenomenon of the display panel during indoor use, while the photochromic layer 140 may turn to the same color as the color film sub-layer 160 during outdoor use, thereby improving the overall contrast of the display panel.

According to the embodiments of the present disclosure, the colors of the color film sub-layer 160 and the photochromic layer 140 under irradiation of natural light may be selected by those skilled in the art depending on practical display effects. In some embodiments of the present disclosure, both the first color film layer 151 of the first sub-pixel 131 and the color film sub-layer 160 are formed from a red color resist, and the photochromic layer 140 may be formed from a red fluorescent material which comprises $Y_{0.65}Bi_{0.3}VO_4$. In some other embodiments of the present disclosure, both the second color film layer 152 of the second sub-pixel 132 and the color film sub-layer 160 are formed from a blue color resist, and the photochromic layer 140 is formed from a blue fluorescent material which comprises $Sr_5(PO_4)_3Cl_2Eu^{2+}$. In some other embodiments of the present disclosure, both the third color film layer 153 of the third sub-pixel 133 and the color film sub-layer 160 are formed from a green color resist, and the photochromic layer 140 is formed from a green fluorescent material which comprises $Ca_5Mg_4(VO_4)_6$. As such, in different pixel units, both the color of the color resist for forming the color film sub-layer 160 and the fluorescent color of the ultraviolet fluorescent material for forming the photochromic layer 140 are red, blue or green respectively, such that a white color with higher contrast is produced by combining every three pixel units.

Figure 5:
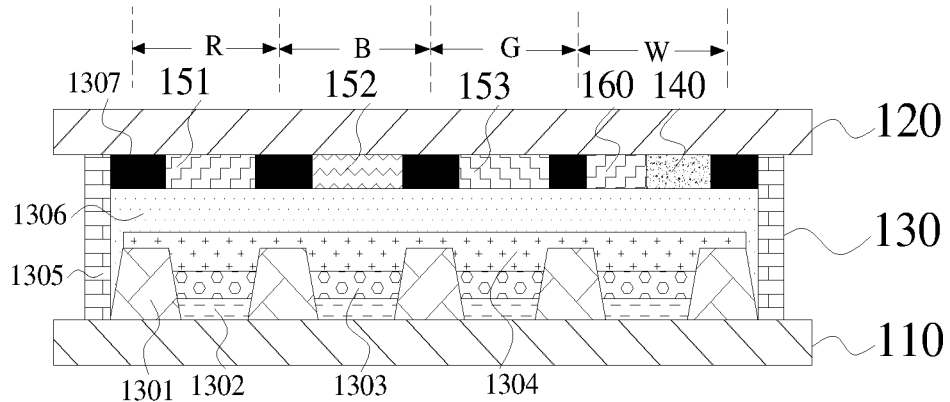
FIG. 5 is a schematic diagram of the section structure of a display panel according to another embodiment of the present disclosure.

According to the embodiments of the present disclosure, the type of the pixel structure 130 is not particularly limited, for example, it may be a pixel structure of an OLED or LCD, and may be designed by those skilled in the art depending on the use requirements for the display panel. In some embodiments of the present disclosure, the pixel structure of an OLED is selected. With reference to FIG. 5, in addition to the above-mentioned color film layer 150 (comprising the first color film layer 151, the second color film layer 152 and the third color film layer 153), color film sub-layer 160 and photochromic layer 140, the pixel structure 130 may further comprise a pixel definition layer 1301, a reflection electrode 1302 (the material of which may be preferably ITO/Ag/ITO or the like), an organic light emitting layer 1303, a transparent electrode 1304 (the material of which may be Mg/Al, IZO, or the like), a bank 1305, a filling layer 1306, a black matrix 1307, and so on. Different sub-pixel regions are defined by the pixel definition layer 1301, and typically, two adjacent sub-pixel regions may be divided by a central line of a portion of the pixel definition layer 1301 between the two adjacent sub-pixels. In the case where the black matrix 1307 is present, different sub-pixel regions may also be defined by both the pixel definition layer 1301 and the black matrix 1307. The orthographic projection of the photochromic layer 140 on the first substrate 110 is at least partially overlapped with the orthographic projection of the light emitting layer 1303 of the white sub-pixel 134 on the first substrate 110. As such, both the structure and function of the display panel can be more perfect by using the pixel structures 130 with the above configuration.

In summary, according to the embodiments, the present disclosure provides a display panel having a four color sub-pixel structure, wherein, by disposing a photochromic layer in a white sub-pixel region of the four color sub-pixel structure, the photochromic layer, when directly irradiated by natural light, can absorb the natural light and turn to a dark color from colorless. As a result, the screen whitening problem when displaying a black image is alleviated, while the overall contrast of the screen is improved, and also the light output ratio will not be influenced significantly.

In another aspect, the present disclosure provides a method for manufacturing a display panel.

Figure 6:
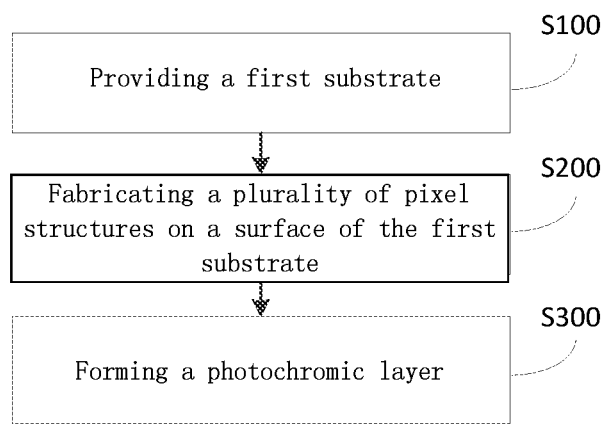
FIG. 6 is a schematic flow chart of a method for manufacturing a display panel according to an embodiment of the present disclosure.

According to embodiments of the present disclosure, with reference to FIG. 6, the manufacturing method comprises the following steps.

S100: Providing a first substrate.

In this step, a first substrate 110 is provided, and a plurality of pixel unit regions are defined on the first substrate 110, each of the pixel unit region comprising a first sub-pixel region, a second sub-pixel region, a third sub-pixel region and a white sub-pixel region. According to the embodiments of the present disclosure, the first sub-pixel region may be one of a red (R) sub-pixel region, a green (G) sub-pixel region, or a blue (B) sub-pixel region, the second sub-pixel region may be another one of the red (R) sub-pixel region, the green (G) sub-pixel region or the blue (B) sub-pixel region, and the third sub-pixel region may be the remaining one of the red (R) sub-pixel region, the green (G) sub-pixel region or the blue (B) sub-pixel region.

S200: Fabricating a plurality of pixel structures on a surface of the first substrate.

In this step, a plurality of pixel structures 130 are fabricated on a surface of the first substrate 110, each of the pixel structures 130 comprising a first sub-pixel, a second sub-pixel, a third sub-pixel and a white sub-pixel, that is, the first sub-pixel is fabricated in the first sub-pixel region, the second sub-pixel is fabricated in the second sub-pixel region, the third sub-pixel is fabricated in the third sub-pixel region, and the white sub-pixel is fabricated in the white sub-pixel region on the first substrate 110. According to the embodiments of the present disclosure, the number of the pixel structures is not particularly limited, and may be designed by those skilled in the art depending on the resolution of the display panel finally manufactured, which will not be reiterated here.

According to the embodiments of the present disclosure, the process for manufacturing the pixel structures 130 is not particularly limited, and may be designed by those skilled in the art depending on the configuration of the pixel structures 130. In some embodiments of the present disclosure, the following steps may be performed sequentially on a surface of the first substrate 110: forming a pixel definition layer 1301 by lithography (applying, exposing and etching), forming a reflection electrode 1302 by sputtering or deposition, forming a light emitting layer 1303 by evaporation, forming a transparent electrode 1304 by vacuum evaporation or sputtering, forming a bank 1305, and forming a filling layer 1306 by filling and curing. In this way, a pixel structure 130 more perfect in both the structure and function can be fabricated by the above process.

S300: Forming a photochromic layer.

In this step, a photochromic layer 140 is formed, wherein the orthographic projection of the photochromic layer 140 on the first substrate 110 is covered by the orthographic projection of the white sub-pixel 134 on the first substrate 110. In some embodiments of the present disclosure, the photochromic layer 140 may be directly formed in the white sub-pixel region on a surface of the plurality of pixel structures 130 fabricated in S200 away from the first substrate 110. In this way, a display panel with a thinner thickness can be obtained. In some other embodiments of the present disclosure, the photochromic layer 140 may be formed in a white sub-pixel region of a second substrate 120. In this way, after the first substrate 110 and the second substrate 120 are assembled with cells aligned, it may also allow the orthographic projection of the photochromic layer 140 on the first substrate 110 to be covered by the orthographic projection of the white sub-pixel 134 on the first substrate 110.

According to the embodiments of the present disclosure, the method for forming the photochromic layer 140 is not particularly limited, and may be selected by those skilled in the art depending on particular material for forming the photochromic layer 140. In some embodiments of the present disclosure, step S300 may comprise applying an organic resin containing an ultraviolet fluorescent material in the white sub-pixel region of the second substrate 120 to form a photochromic layer 140. In this way, the same fabrication process as the color film layer 150 in other sub-pixel regions may be used without designing and manufacturing additional equipment, so that the manufacture cost of the display panel will not be increased significantly.

Figure 7:
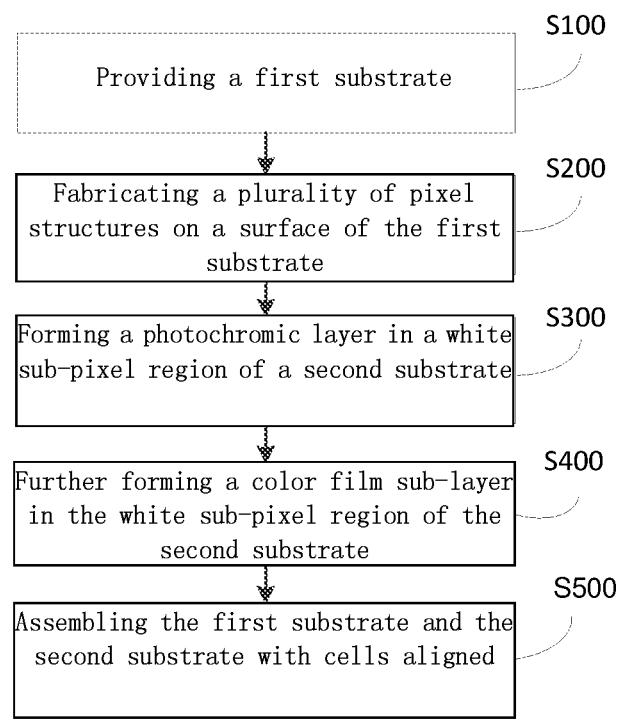
FIG. 7 is a schematic flow chart of a method for manufacturing a display panel according to another embodiment of the present disclosure.

In some embodiments of the present disclosure, with reference to FIG. 7, the method may further comprise, after step S300:

S400: Further forming a color film sub-layer in the white sub-pixel region of the second substrate.

In this step, a color film sub-layer 160 is further formed in the white sub-pixel region of the second substrate 120, wherein the color film sub-layer 160 may be formed along with a first color film layer 151 of the first sub-pixel region, a second color film layer 152 of the second sub-pixel region or a third color film layer 153 of the third sub-pixel region by one process. In this way, after subsequent assembling the substrates with cells aligned, an orthographic projection of the color film sub-layer 160 on the first substrate 110 is not overlapped with the orthographic projection of the photochromic layer 140 on the first substrate 110.

In some embodiments of the present disclosure, a black matrix 1307 may be formed by deposition and patterning on a surface of the second substrate 120 in advance, the first color film layer 151, the second color film layer 152, the third color film layer 153, the color film sub-layer 160 and the photochromic layer 140 may be then formed by applying respectively in different sub-pixel regions of the black matrix 1307, wherein the color film sub-layer 160 may be formed along with the first color film layer 151, the second color film layer 152, or the third color film layer 153 by one applying process. In this way, it requires only 4 applying processes to obtain the above-mentioned 5-layer structure.

S500: Assembling the first substrate and the second substrate with cells aligned.

In this step, the first substrate 110 and the second substrate 120 are assembled with cells aligned. In this way, a more energy-saving and humanized display panel with high contrast and high luminescence efficiency can be obtained.

In summary, according to the embodiments, the present disclosure provides a manufacturing method by which a display panel with a photochromic layer disposed in a white sub-pixel region can be manufactured. As a result, the contrast of the screen of the display panel is improved without significantly influencing the light output ratio, and there is no additional fabrication step in the manufacture method.

In another aspect, the present disclosure provides a display device. According to the embodiments of the present disclosure, the display device comprises the display panel as described above.

According to the embodiments of the present disclosure, the type of the display device is not particularly limited, and may be any of commonly used display device type in the art. In particular, it may be, for example, a display (including an organic light emitting diode (OLED) display and a liquid crystal display (LCD)), a mobile device, a wearable device, or the like. The type of the display device may be selected by those skilled in the art depending on particular application of the display device, which will not be reiterated here. It should be noted that in addition to the display panel, the display device further comprises other essential parts and components. By taking a display as an example, the display device further comprises, for example, a housing, a wiring board, a power wire, or the like. Other parts or components may be supplemented by those skilled in the art depending on particular use requirements of the display device, which will not be reiterated here.

In summary, according to the embodiments, the present disclosure provides a display device comprising a display panel. The display panel has high contrast and high luminescence efficiency, so that the display device is more energy-saving and humanized, thus having a better market competitiveness. It can be appreciated by those skilled in the art that the features and advantage described with respect to the display panel still apply to the display device, and will not be reiterated here.

In the description of the present disclosure, it should be understood that direction or position relationship indicated by the term "center", "longitudinal", "transverse", "length", "width", "thickness", "above", "below", "front", "back", "left", "right", "vertical", "horizontal", "top", "bottom", "in", "out", "clockwise", "anti-clockwise", "axial", "radial", "circumferential" or the like is described on the basis of the direction or position relationship shown in figure(s), and it is only for the purpose of describing the present disclosure conveniently and simplifying the description, but it does not indicate or imply that the referred device or member must have a particular direction or position, or be constructed or operated in a particular direction or position. As a result, it should not be interpreted as limiting the present disclosure.

Furthermore, the term "first", "second" or "third" is only used for description purpose, but cannot be understood to indicate or suggest the relative importance or to imply the amount of the indicated technical feature. Therefore, the feature defined with "first", "second" or "third" may explicitly or implicitly comprise at least one of said feature. In the description of the present disclosure, unless specifically and particularly defined otherwise, "a plurality of" refers to at least two, for example, two, three and so on.

In the description of this specification, the description with reference to term "an embodiment", "some embodiments", "example", "particular example", "some examples", or the like means that the particular feature, structure, material or characteristic described with reference to the embodiment or example is included in at least one embodiment or example of the present disclosure. In this specification, the exemplary expressions of the above terms are not required to refer to the same embodiment or example. And the particular feature, structure, material or characteristic described can be combined in a suitable manner in any one or more embodiments or examples. Further, without contradicting with each other, different embodiments or examples as well as the features of different embodiments or examples described in this specification can be combined by those skilled in the art.

Although some embodiments of the present invention have been shown and described above, it should be understood that the above embodiments are exemplary, and should not be construed as limiting the present invention. A person of ordinary skills in the art can make change, modification, replacement and variation on the above embodiments within the scope of the present invention.

What is claimed is:

1. A display panel comprising:
    a first substrate;
    a plurality of pixel structures disposed on a surface of the first substrate, each of the pixel structures comprising a first sub-pixel, a second sub-pixel, a third sub-pixel and a white sub-pixel;
    a photochromic layer, wherein an orthographic projection of the photochromic layer on the first substrate is covered by an orthographic projection of the white sub-pixel on the first substrate;
    a second substrate opposite to the first substrate, wherein the plurality of pixel structures are disposed between the first substrate and the second substrate, and wherein the photochromic layer is disposed in a white sub-pixel region on a side of the second substrate facing the first substrate; and
    a color film sub-layer disposed in the white sub-pixel region on the side of the second substrate facing the first substrate, wherein an orthographic projection of the color film sub-layer on the first substrate is not overlapped with the orthographic projection of the photochromic layer on the first substrate,
    wherein the photochromic layer and color film layers of the first sub-pixel, the second sub-pixel and the third sub-pixel are disposed in the same layer.

2. The display panel according to claim 1, wherein the orthographic projection of the photochromic layer on the first substrate is at least partially overlapped with an orthographic projection of a light emitting layer of the white sub-pixel on the first substrate.

3. The display panel according to claim 1, wherein the photochromic layer is formed from an ultraviolet fluorescent material.

4. The display panel according to claim 1, wherein the photochromic layer has a thickness of 2 to 3 μm.

5. The display panel according to claim 1, wherein the first sub-pixel is one of a red (R) sub-pixel, a green (G) sub-pixel, or a blue (B) sub-pixel, the second sub-pixel is another one of the R sub-pixel, G sub-pixel or B sub-pixel, and the third sub-pixel is a remaining one of the R sub-pixel, G sub-pixel or B sub-pixel.

6. The display panel according to claim 1, wherein the color film sub-layer is disposed in the same layer as the photochromic layer.

7. The display panel according to claim 6, wherein an area of the orthographic projection of the color film sub-layer on the first substrate is the same as an area of the orthographic projection of the photochromic layer on the first substrate.

8. The display panel according to claim 6, wherein both a first color film layer of the first sub-pixel and the color film sub-layer are formed from a red color resist, and the photochromic layer is formed from a red fluorescent material.

9. The display panel according to claim 6, wherein both a second color film layer of the second sub-pixel and the color film sub-layer are formed from a blue color resist, and the photochromic layer is formed from a blue fluorescent material.

10. The display panel according to claim 6, wherein both a third color film layer of the third sub-pixel and the color film sub-layer are formed from a green color resist, and the photochromic layer is formed from a green fluorescent material.

11. The display panel according to claim 1, wherein the first substrate comprises a flexible substrate or a glass substrate.

12. A display device comprising the display panel according to claim 1.

13. The display device according to claim 12, wherein the display device comprises an organic light emitting diode (OLED) display device or a liquid crystal display (LCD) device.

14. A method for manufacturing a display panel, comprising:
    providing a first substrate;

fabricating a plurality of pixel structures on a surface of the first substrate, each of the pixel structures comprising a first sub-pixel, a second sub-pixel, a third sub-pixel and a white sub-pixel;

forming a photochromic layer, wherein an orthographic projection of the photochromic layer on the first substrate is covered by an orthographic projection of the white sub-pixel on the first substrate;

providing a second substrate;

applying an organic resin containing an ultraviolet fluorescent material in a white sub-pixel region of the second substrate to form the photochromic layer; and forming a color film sub-layer in the white sub-pixel region of the second substrate, wherein the color film sub-layer is formed along with a first color film layer of the first sub-pixel region, a second color film layer of the second sub-pixel region or a third color film layer of the third sub-pixel region by one process.

15. The method according to claim 14, further comprising:

assembling the first substrate and the second substrate with cells aligned, wherein, after the assembling, an orthographic projection of the color film sub-layer on the first substrate is not overlapped with the orthographic projection of the photochromic layer on the first substrate.

* * * * *